(12) United States Patent
Andou

(10) Patent No.: US 9,761,835 B2
(45) Date of Patent: Sep. 12, 2017

(54) DISPLAY DEVICE

(71) Applicant: Japan Display Inc., Tokyo (JP)

(72) Inventor: Naohisa Andou, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/073,274

(22) Filed: Mar. 17, 2016

(65) Prior Publication Data

US 2016/0276626 A1    Sep. 22, 2016

(30) Foreign Application Priority Data

Mar. 20, 2015  (JP) ................................ 2015-058275

(51) Int. Cl.

| | |
|---|---|
| *H01L 29/18* | (2006.01) |
| *H01L 51/52* | (2006.01) |
| *H01L 51/00* | (2006.01) |
| *H01L 27/32* | (2006.01) |

(52) U.S. Cl.
CPC ...... *H01L 51/5253* (2013.01); *H01L 51/5246* (2013.01); *H01L 27/3244* (2013.01); *H01L 51/0097* (2013.01); *H01L 51/5228* (2013.01); *H01L 2251/5338* (2013.01)

(58) Field of Classification Search
CPC ............ H01L 51/5246; H01L 51/5253; H01L 27/3244; H01L 51/0097; H01L 51/5338; H01L 51/525; H01L 51/5228
See application file for complete search history.

(56) References Cited

U.S. PATENT DOCUMENTS

| | | | |
|---|---|---|---|
| 2007/0152577 A1 | 7/2007 | Cho et al. | |
| 2009/0207370 A1* | 8/2009 | Tsuchiya | G02F 1/1339 349/153 |
| 2011/0037059 A1* | 2/2011 | Gyoda | H01L 27/3276 257/40 |
| 2013/0002133 A1 | 1/2013 | Jin et al. | |
| 2014/0247405 A1 | 9/2014 | Jin et al. | |
| 2014/0254111 A1* | 9/2014 | Yamazaki | H01L 51/0097 361/749 |

FOREIGN PATENT DOCUMENTS

| | | |
|---|---|---|
| JP | 2007183605 A | 7/2007 |
| JP | 2013015835 A | 1/2013 |

* cited by examiner

*Primary Examiner* — Yosef Gebreyesus
(74) *Attorney, Agent, or Firm* — Typha IP LLC

(57) ABSTRACT

A display device includes a protective film attached to a display surface as a surface of at least one of a first insulating substrate and a second insulating substrate, and an adhesive material attaching the protective film to the display surface. The display surface includes a display area in which an image is displayed, and a peripheral area surrounding the display area. The adhesive material includes a first adhesive portion and a second adhesive portion. The first adhesive portion is in the peripheral area, and discontinuously surrounds the display area with a disconnected portion. The second adhesive portion is provided in the peripheral area inside or outside the first adhesive portion and the disconnected portion with a gap between the second adhesive portion, and the first adhesive portion and the disconnected portion, so as to be next to the disconnected portion over the entire length thereof.

8 Claims, 6 Drawing Sheets

DISPLAY DEVICE

CROSS-REFERENCE TO RELATED APPLICATION

The present application claims priority from Japanese application JP2015-058275 filed on Mar. 20, 2015, the content of which is hereby incorporated by reference into this application.

BACKGROUND OF THE INVENTION

1. Field of the Invention

The present invention relates to a display device.

2. Description of the Related Art

JP2007-183605 A discloses a flexible display in which semiconductor light-emitting elements are disposed at predetermined intervals on a plastic substrate having flexibility so that the display can be curved without impairing the luminous efficiency and life of the semiconductor light-emitting elements.

Moreover, JP 2013-015835 A discloses a flexible splay panel including a first display area, a second display area extending from the first display area and forming a curved surface, and a non-display area disposed in a position not seen by a user, for reducing the non-display area recognized by the user.

SUMMARY OF THE INVENTION

In a sheet-like display device, a protective film may be attached to protect the surface or prevent an excessive bending. The protective film is attached with a double-sided adhesive sheet. In that case, if the air enters between the protective film and the double-sided adhesive sheet, irregularities due to air bubbles remain on the surface of the protective film, and thus the display device may fail to obtain a desired shape as a final product.

It is an object of the invention to prevent the occurrence of irregularities due to the inclusion of air bubbles on the surface of a display device.

A display device according to an aspect of the invention includes: a first insulating substrate and a second insulating substrate both having flexibility; a self-emitting element layer stacked on the first insulating substrate, provided between the first insulating substrate and the second insulating substrate, and provided so as to emit light toward a display surface, the self-emitting element layer being disposed such that luminance is controlled in each of a plurality of unit pixels constituting an image; a protective film attached, on the display surface side, to a surface of at least one of the first insulating substrate and the second insulating substrate; and an adhesive material attaching the protective film to the display surface, wherein the display surface includes a display area in which the image is displayed, and a peripheral area surrounding the display area, and the adhesive material includes a first adhesive portion and a second adhesive portion, the first adhesive portion is in the peripheral area, and discontinuously surrounds the display area with a disconnected portion, and the second adhesive portion is in the peripheral area inside or outside the first adhesive portion and the disconnected portion with a gap between the second adhesive portion, and the first adhesive portion and the disconnected portion, so as to be next to the disconnected portion over an entire length thereof. According to this, it is possible to prevent the occurrence of irregularities due to the inclusion of air bubbles on the surface of the display device.

DETAILED DESCRIPTION OF THE INVENTION

Figure 1:
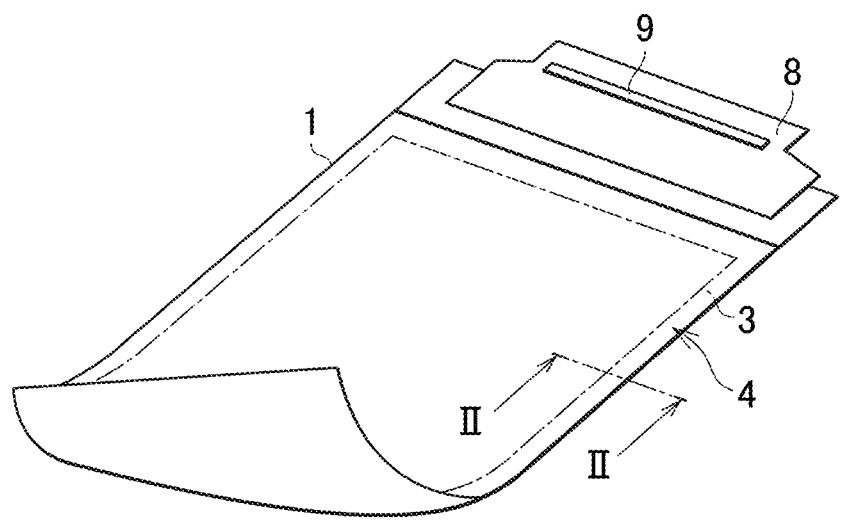
FIG. 1 is a perspective view of a display device according to an embodiment of the invention.
Figure 1:
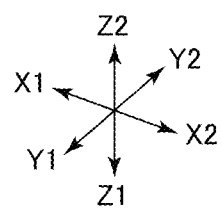

Hereinafter, a mode for implementing the invention (hereinafter referred to as "embodiment") will be described. The disclosure of the specification is merely an example of the invention. Appropriate modifications that fall within the gist of the invention and will readily occur to those skilled in the art are included in the scope of the invention. Moreover, the width, thickness, shape, and the like of each portion shown in the drawings are schematically represented, and do not limit the interpretation of the invention.

[1. External Appearance Of Display Device]

FIG. 1 is a perspective view showing an external appearance of a display device 1 according to an embodiment of the invention. The display device 1, which is formed in the form of a sheet, has flexibility, and can display an image in a display area 3 provided on a display surface of the display device 1 even in a deflected state. The display surface of the display device 1 is provided with the display area 3 in which an image is displayed, and a peripheral area 1 surrounding the display area 3.

The display device 1 receives an image signal through various types of publicly known devices to thereby display an image in the display area 3. The display device 1 is connected to, for example, a flexible printed board 8 on which a chip-like driver IC 9 is mounted. In this case, the driver IC 9 outputs the image signal to the display device 1, so that an image is displayed in the display area 3. The driver IC 9 may be mounted on the flexible printed board 8 by a method such as chip on film (COF).

[2. Configuration Of Display Device]

Figure 2:
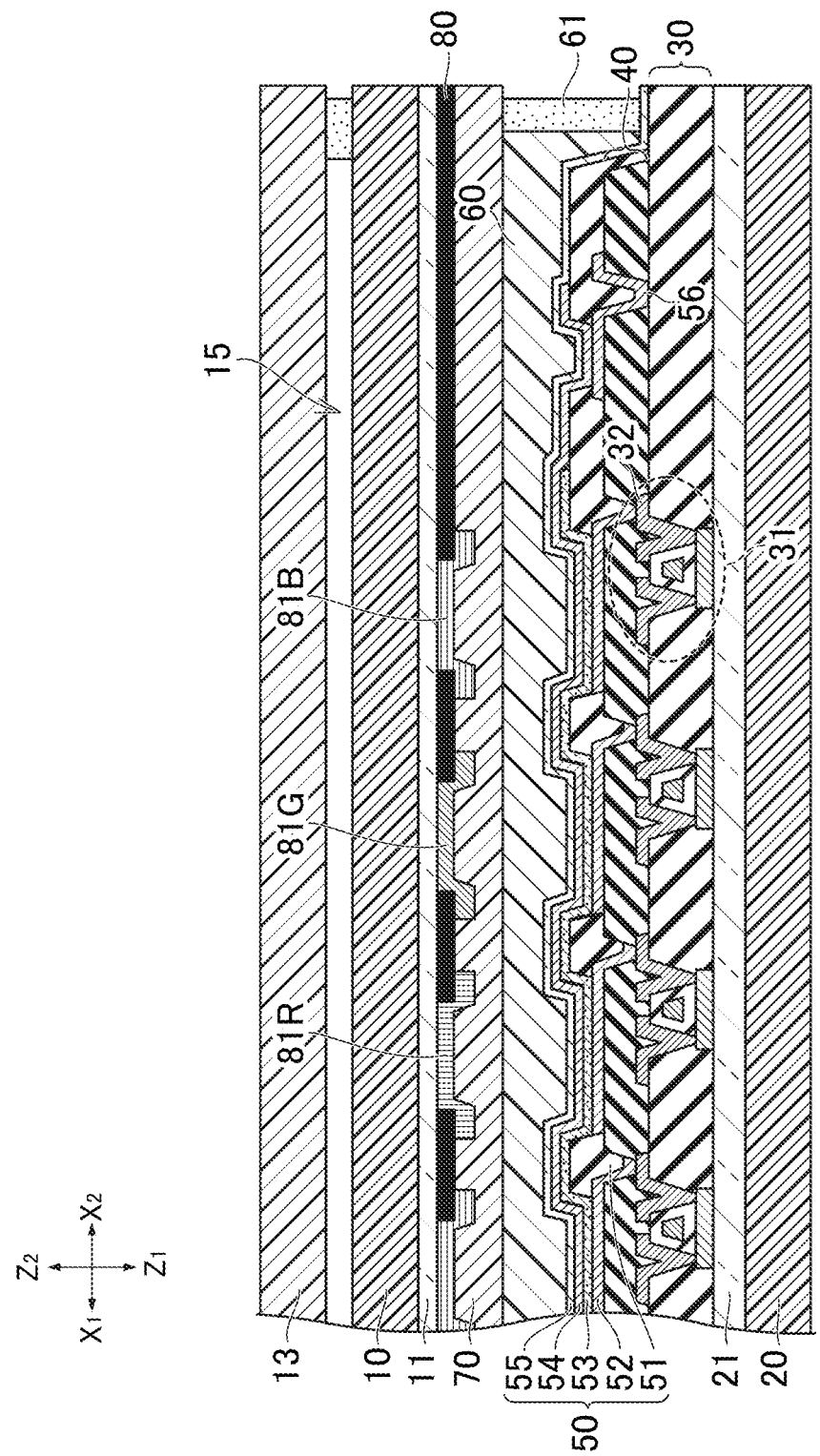
FIG. 2 is a cross-sectional view showing an example of the configuration of the display device.

FIG. 2 is a cross-sectional view showing an example of the configuration of the display device 1, and the plane of section is indicated by the line II-II in FIG. 1. In the display device 1 as shown in the drawing, a first barrier layer II, a color filter layer 80, an overcoat layer 70, a filling layer 60, a self-emitting element layer 50, a planarizing layer 40, a circuit layer 30, a second barrier layer 21, and a second insulating substrate 20 are stacked below a first insulating substrate 10 (in the Z1 direction in FIG. 2). Moreover, a protective film 13 is attached to the outer surface of the first insulating substrate 10 with an adhesive material 12.

The (display device 1 according to the embodiment adopts a top emission method, in which a display surface that displays an image (that is, a surface including the display area 3 and the peripheral area 4) is formed on the first insulating substrate 10 side. More specifically, the self-emitting element layer 50 is provided so as to emit light upward (in the Z2 direction in FIG. 2) toward the display surface that is, the first insulating substrate 10). Moreover, the filling layer 60 disposed on the self-emitting element layer 50, the overcoat layer 70, the color filter layer 80, the second barrier layer 21, and the second insulating substrate 20 are formed of a light-transmitting material (for example, a transparent material or a semi-transparent material colored in a given color).

The self-emitting element layer 50 emits light of a plurality of unit pixels constituting an image (hereinafter also referred to as "display image") displayed in the display area 3 (see FIG. 1). The self-emitting element layer 50 is formed to include, for example, an organic layer 53 in which a charge transport layer, a charge injection layer, a light-emitting layer, and the like are stacked as shown in FIG. 2 The light of the unit pixel is emitted due to a current flowing into the organic layer 53.

In the self-emitting element layer 50, the organic layer 53 is formed so as to cover a surface on which pixel electrodes 52 and a bank layer 51 are formed, and further, a common electrode 54 and a sealing layer 55 are formed so as to cover the surface of the organic layer 53.

The bank layer 51 is formed of an insulator such as resin, and disposed so as to surround the perimeter of each of the plurality of unit pixels. The bank layer 51 is disposed in this manner, so that contact between the pixel electrodes 52 adjacent to each other is prevented for each of the unit pixels.

The pixel electrodes 52 are formed of a given conductive material, and subjected to processing (for example, etching processing) so as to be separated from each other between the unit pixels. When the display device 1 adopts the top emission method as in the embodiment, the pixel electrode 52 may contain a light-reflecting material such as metal (for example, Ag).

The common electrode 54 is formed of, for example, indium tin oxide (ITO) or indium zinc oxide (IZO). However, the material is not limited to this as long as the material is a transparent conductive material. The organic layer 53 and the common electrode 54 may be disposed over all of the unit pixels in the display area 3.

The sealing layer 55 is formed of, for example, an inorganic material such as $SiO_x$ or $SiN_y$. However, the material is not limited to this as long as the material is a transparent material. The sealing layer 55 is disposed so as to cover the upper side of the common electrode 54, and prevents the entry of oxygen or moisture into the common electrode 54 or the organic layer 53.

The color filter layer 80 is formed above the self-emitting element layer 50. The color filter layer 80 is provided with a color filter 81 that transmits light in a predetermined color for each of the plurality of unit pixels. More specifically, a color filter 81R that transmits light in red, a color filter 81G that transmits light in green, and a color filter 81B that transmits light in blue are formed in the color filter layer 80. That is, the color filter layer 80 colors the light in red, green, and blue, and emits the light of each of the unit pixels constituting the display image.

The planarizing layer 40 and the circuit layer 30 are stacked between the self-emitting element layer 50 and the first insulating substrate 10. The planarizing layer 40 is formed of an insulator such as resin. A contact hole is formed in the planarizing layer 40 at each place where the planarizing layer 40 is in contact with a portion of a driving wiring line 32 described later. The pixel electrode 52 and the driving wiring line 32 are connected through the contact hole.

The circuit layer 30 is formed to include a circuit portion 31 for controlling the image display in the display area 3. The circuit portion 31 includes a thin film transistor (TFT) or a capacitor, and controls the supply of a current to the plurality of pixel electrodes 52. More specifically, a driver TFT included in the circuit portion 31 is brought into an ON state based on the image signal output from the driver IC 9 (see FIG. 1), so that a current flows into the driving wiring line 32 connected to the driver TFT, the pixel electrode 52 electrically connected to the driving wiring line 32, the organic layer 53, and the common electrode 54, and thus the light of the unit pixel is emitted from the organic layer 53.

Here, the amount of current supplied to the pixel electrode 52 provided for each of the plurality of unit pixels is controlled, so that the luminance of light of each of the unit pixels is controlled. That is, the self-emitting element layer 50 is disposed such that the luminance is controlled in each of the plurality of unit pixels constituting the display image.

In the self-emitting element layer 50, a conductive portion 56 formed of a given conductive material is disposed outside the display area 3 (specifically, outside an area where the color filter 81 is disposed). As shown in FIG. 2, the conductive portion 56 is disposed in the same layer as the pixel electrode 52, and electrically connected to the common electrode 54 extending to the outside of the display area 3. The resistance value of a material constituting the conductive portion is preferably smaller than the resistance value of a material constituting the common electrode 54. A current that flows through the organic layer 53 reaches the common electrode 54, and is drawn through the conductive portion 56. Moreover, an auxiliary wiring line of the common electrode 54 may be provided in the display area using the same layer as the conductive portion 56 so as to be partially connected to the common electrode 54. The auxiliary wiring line prevents an increase in the electrical resistance of the entire common electrode 54, and thus the amount of current flowing through the organic layer 53 can be stable in its pane.

The filling layer 60 and the overcoat layer 70 are stacked between the self-emitting element layer 50 and the color filter layer 80. The filling layer 60 is formed of, for example, a transparent filling material poured into a place surrounded by a sealing material 61 that functions as a dam. The overcoat layer 70 is formed of, for example, a given organic material, and prevents the diffusion of a dye contained in the color filter 81.

In the display device 1, the first insulating substrate 10 and the second insulating substrate 20 are formed so as to interpose the self-emitting element layer 50 therebetween. The first insulating substrate 10 and the second insulating substrate 20 have flexibility, and permit, to some extent, bending in the up-and-down direction or extension in the left-and-right direction. The material of the first insulating substrate 10 and the second insulating substrate 20 may be, for example, polyimide, but is not limited to this as long as the material has flexibility, and is transparent if used for the first insulating substrate 10. The second insulating substrate 20 may be opaque.

The first barrier layer 11 is formed between the first insulating substrate 10 and the color filter layer 80. Moreover, the second barrier layer 21 is formed between the second insulating substrate 20 and the circuit layer 30. The first barrier layer 11 and the second barrier layer 21 are formed of, for example, an inorganic material such as $SiO_x$ or $SiN_y$, and prevent the entry of air or moisture into the self-emitting element layer 50, the circuit layer 30, or the like. It is sufficient for the first barrier layer 11 to be transparent, and the first barrier layer 11 may be formed of another publicly known material. Moreover, the second barrier layer 21 may be opaque.

The protective film 13 is attached to the surface of the first insulating substrate 10 as the display surface, with the adhesive material 12 which is adhesive on both sides The protective film 13 is formed to be transparent using, for example, PET as a material, and protects the surface of the first insulating substrate 10 from flaws or dirt. Moreover, a space 15 defined by the protective film 13, the first insulating substrate 10 as the display surface, and the adhesive material 12 is formed inside the protective film 13.

[3. Shape Of Adhesive Material]

In the related art, an adhesive material for attaching the protective film 13 to the surface of the first insulating substrate is formed in a rectangular shape so as to mostly cover the entire surface of the first insulating substrate 10. For this reason, if the air enters between the adhesive material and the protective film 13 and causes air bubbles, it is difficult to push the air bubbles outward, and thus irregularities due to the air bubbles may remain on the surface of the display device. Therefore, the adhesive material 12 according to the embodiment is provided such that the occurrence of the irregularities due to the air bubbles is prevented by outwardly discharging the air between the adhesive material 12 and the protective film 13.

Figure 3:
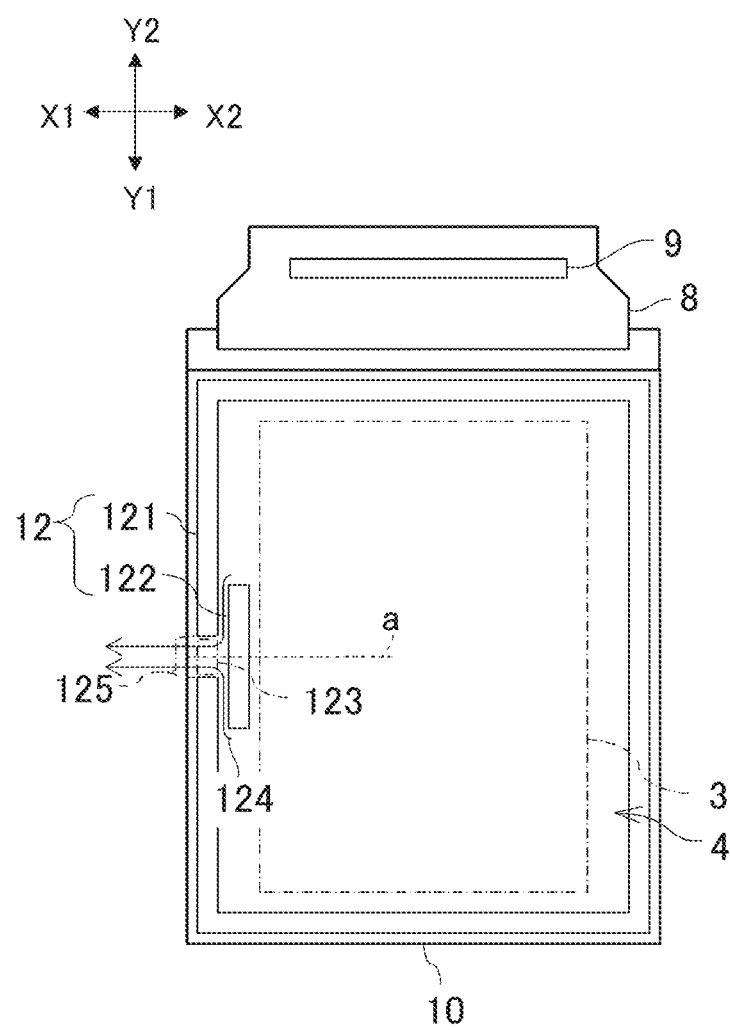
FIG. 3 shows an example of the shape of an adhesive material.

FIG. 3 shows an example of the shape of the adhesive material 12. As shown in the drawing, the adhesive material 12 includes, in the peripheral area 4 surrounding the display area 3, a first adhesive portion 121 and a second adhesive portion 122. More specifically, the first adhesive portion 121 discontinuously surrounds the display area 3 with a disconnected portion 123 at at least one place. Moreover, the second adhesive portion 122 is provided inside the first adhesive portion 121 and the disconnected portion 123 with a gap between the second adhesive portion 122, and the first adhesive portion 121 and the disconnected portion 123, so as to be next to the disconnected portion 123 over the entire length thereof.

Here, the second adhesive portion 122 is long in a direction (the Y-axis direction in FIG. 3) in which the second adhesive portion 122 surrounds the display area 3, and the second adhesive portion 122 is next to the first adhesive portion 121 at both ends of the disconnected portion 123. Moreover, in the embodiment, the first adhesive portion 121 and the second adhesive portion 122 are provided separately from each other.

Since the adhesive material 12 includes the first adhesive portion 121 and the second adhesive portion 122, the space 15 (see FIG. 2) in the interior of the protective film 13 includes an opening 125 at the disconnected portion 123 through a flow path 124 as the gap formed between the first adhesive portion 121 and the second adhesive portion 122. In other words, the space 15 in the interior of the protective film 13 is connected to the outside of the display device 1 through the flow path 124 as the gap formed between the first adhesive portion 121 and the second adhesive portion 122.

The air interposed between the protective film 13 and the first insulating substrate 10 is discharged outward through the flow path 124 and the opening 125. For this reason, the thickness of the space 15 interposed between the protective film 13 and the first insulating substrate 10 is kept uniform. That is, the display device 1 includes the adhesive material 12, so that it is possible to prevent the occurrence of irregularities due to the inclusion of air bubbles.

Even when the adhesive material 12 does not include the second adhesive portion 122 and only includes the first adhesive portion 121 which is discontinuous at the disconnected portion 123, the air in the space 15 can be discharged outward. In this case, however, the thickness of the adhesive material 12 is not secured at the disconnected portion 123, and thus it is feared that the display device 1 will be easily folded at this portion.

Therefore, the adhesive material 12 according to the embodiment is provided with the second adhesive portion 122, so that the strength for bending or extension at the disconnected portion 123 is reinforced. For example, even when a force to fold the display device 1 acts in a direction. (a direction along the dotted line a in FIG. 3) crossing the disconnected portion 123, the adhesive material 12 has the thickness of the second adhesive portion 122 in an area next to the disconnected portion 123. Therefore, it is possible to prevent an excessive folding of the display device 1 and prevent the breakage of the display device 1 or the deterioration of the entire device.

[5. Modified Examples]

The invention is not limited to the embodiment described above, and various modifications may be made. Hereinafter, examples of other modes (modified examples) for implementing the invention will be described.

[5-1. Modified Example (1) of Adhesive Material]

Figure 4:
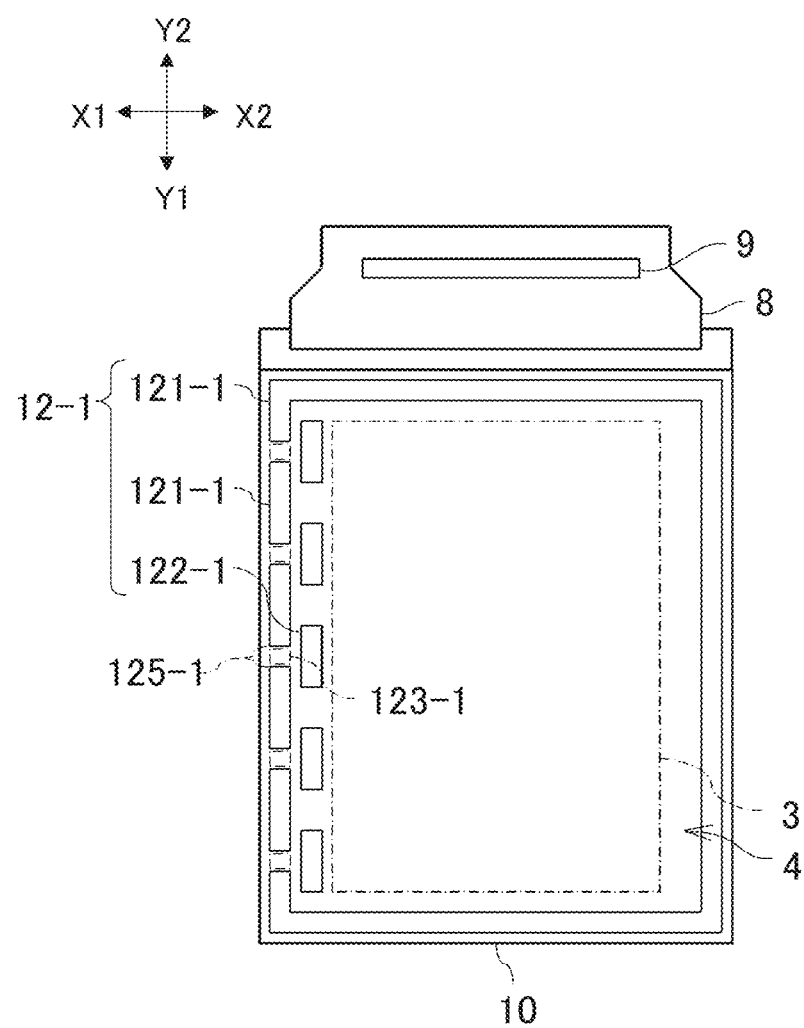
FIG. 4 shows a modified example of the adhesive material.

FIG. 4 shows an adhesive material (12-1) as Modified Example (1) of the adhesive material 12. In the adhesive material (12-1) as shown in the drawing, a first adhesive portion (121-1) may be discontinuously provided due to a plurality of disconnected portions (123-1) located at a plurality of places, and a second adhesive portion (122-1) may be provided so as to be divided into pieces corresponding to the disconnected portions (123-1). In this case, the space in the interior of the protective film 13 includes a plurality of openings (125-1) at the plurality of disconnected portions (123-1). That is, since the number of openings is increased compared with the case of using the adhesive material 12 described in the embodiment, the air interposed between the display surface and the protective film 13 can be discharged more efficiently.

The second adhesive portions (122-1) may be continuously provided so as to be sequentially connected to each other. In this case, however, a distance from an end of the second adhesive portion (122-1) to one of the openings (125-1) is increased, so that air discharging efficiency is reduced.

[5-2. Modified Example (2) of Adhesive Material]

Figure 5:
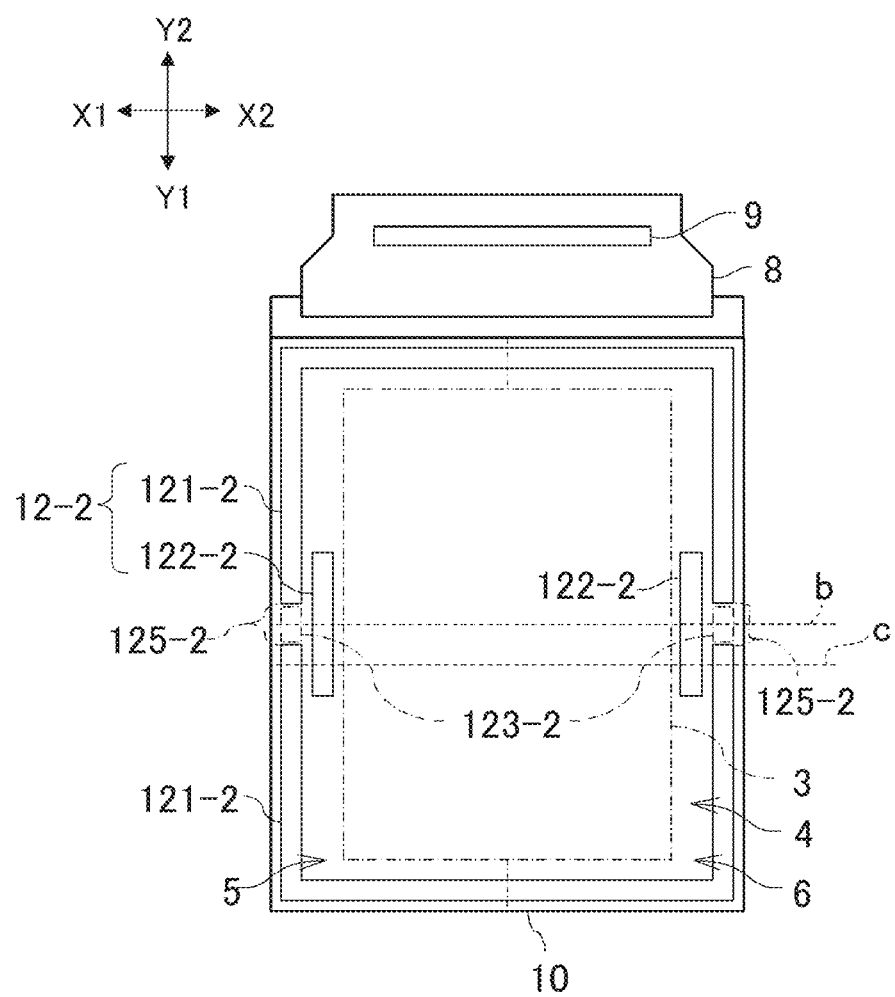
FIG. 5 shows a modified example of the adhesive material.

FIG. 5 shows an adhesive material (12-2) as Modified Example (2) of the adhesive material 12. As shown in the drawing, the peripheral area 4 surrounding the display area 3 includes a first side area 5 and a second side area 6 located on both sides of the display area 3 interposed therebetween in a first direction (the X-axis direction in FIG. 5, hereinafter also referred to as "lateral direction"). Here, disconnected portions (123-2) of the adhesive material. (12-2) may be each formed in the first side area 5 and the second side area 6. In this case, the space in the interior of the protective film 13 includes an opening (125-2) at each of edges facing in the lateral direction, so that the air can be discharged without a bias in either the left or right direction.

[5-3. Modified Example (3) of Adhesive Material]

As in Modified Example (2) shown in FIG. 5, when a place where the disconnected portion (123-2) is formed in the first side area 5 and a place where the disconnected portion (123-2) is formed in the second side area 6 are coincident with each other in a second direction (the Y-axis direction in FIG. 5, hereinafter also referred to as "vertical direction") substantially orthogonal to the first direction (the lateral direction), a place having no thickness corresponding to that of a first adhesive portion (121-2) and thus reduced in strength for bending is concentrated at the same position in the vertical direction in each of the first side area 5 and the second side area 6. Specifically, the strength on a line (for example, the dotted line b in FIG. 5) passing through the two disconnected portions (123-2) in the lateral direction is low compared to the strength on a line (for example, the dotted line c in FIG. 5) passing through a first adhesive portion (121-2) and a second adhesive portion (122-2) in the lateral direction.

Figure 6:
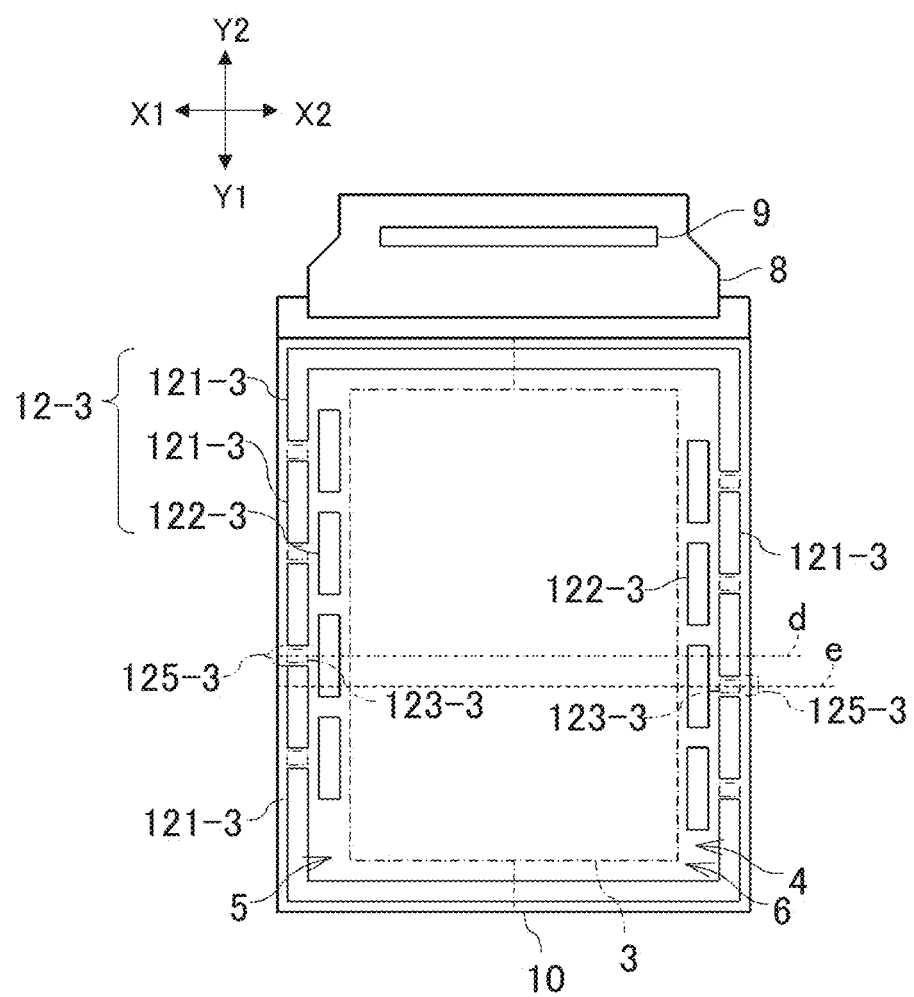
FIG. 6 shows a modified example of the adhesive material

FIG. 6 shows an adhesive material (12-3) as Modified Example (3) of the adhesive material 12. As shown in the drawing, a place (first place) of the adhesive material (12-3) where each of disconnected portions (123-3) is formed in the first side area 5 and a place (second place) of the adhesive material (12-3) where each of disconnected portions (123-3) is formed in the second side area 6 may be located at positions shifted in the vertical direction (the second direction, the Y-axis direction in FIG. 6).

In this case, a first adhesive portion (121-3) on the second side area 6 side is disposed on a line (for example, the dotted line d in FIG. 6) passing through the disconnected portion (123-3) on the first side area 5 side in the lateral direction (the first direction, the X-axis direction in FIG. 6), so that the strength for bending is reinforced. Similarly, a first adhesive portion (121-3) on the first side area 5 side is disposed on a line (for example, the dotted line e in FIG. 6) passing through the disconnected portion (123-3) on the second side area 6 side in the lateral direction, so that the strength is reinforced. In this manner, the places reduced in strength are arranged so as not to be aligned with each other in the vertical direction of the first side area 5 and the second side area 6, so that it is possible to more reliably prevent the folding of the display device 1 and prevent the breakage of the display device 1 or the deterioration of the entire device.

[5-4. Other Modified Examples of Adhesive Material]

Although the embodiment (see FIG. 3) has been described in which the second adhesive portion 122 is provided inside the first adhesive portion 121 and the disconnected portion. 123 with the gap between the second adhesive portion 122, and the first adhesive portion 121 and the disconnected portion 123, so as to be next to the disconnected portion 123 over the entire length thereof, the second adhesive portion 122 may be provided outside the first adhesive portion 121 and the disconnected portion 123 with a gap between the second adhesive portion 122, and the first adhesive portion 121 and the disconnected portion 123. Moreover, for example, as long as the flow path 124 is connected to the opening 125 is formed at one of the upper and lower ends of the second adhesive portion 122, the air between the display surface and the protective film 13 can be discharged. Therefore, the second adhesive portion 122 may be connected to one of the first adhesive portions 121 disposed above and below the disconnected portion 123 interposed therebetween.

[5-5. Modified Example of Display Device]

Although the embodiment has been described in which the display device 1 adopts the top emission method and the display surface is formed on the first insulating substrate 10 side, the display device 1 may adopt, for example, a bottom emission method and thus be formed so as to emit the light of the unit pixel from the second insulating substrate 20 side. That is, the second insulating substrate 20 may be used as a display surface. Moreover, the protective film 13 may be attached to the second insulating substrate 20 as a display surface with the adhesive material 12.

Moreover, for example, the display device 1 may emit light to both the first insulating substrate 10 and the second insulating substrate 20. That is, both the first insulating substrate 10 and the second insulating substrate 20 may be used as display surfaces. In this case, the protective film 13 may be attached to both the first insulating substrate 10 and the second insulating substrate 20 as display surfaces.

Moreover, for example, the protective film 13 may be attached to, not only a display surface, but also a non-display surface that does not display an image, with the adhesive material 12. This makes it possible to protect the non-display surface or prevent the folding of the display device 1.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   a first insulating substrate and a second insulating substrate both having flexibility;
   a self-emitting element layer stacked on the first insulating substrate, provided between the first insulating substrate and the second insulating substrate, and provided so as to emit light toward a display surface, the self-emitting element layer being disposed such that luminance is controlled in each of a plurality of unit pixels constituting an image;
   a protective film attached, on the display surface side with a space, to a surface of the second insulating substrate; and
   an adhesive material between the protective film and the surface of the second insulating substrate attaching the protective film to the display surface, wherein
   the display surface includes a display area in which the image is displayed, and a peripheral area surrounding the display area,
   the adhesive material includes a first adhesive portion and a second adhesive portion,
   the first adhesive portion discontinuously surrounds the display area and the space, the first adhesive portion has a cut-out portion between one end of the first adhesive portion and another end of the first adhesive portion,
   the cut-out portion, the one end of the first adhesive portion, and the another end of the first adhesive portion are arranged in a line, and
   the second adhesive portion extends along the cut-out portion, the one end of the first adhesive portion, and the another end of the first adhesive portion.

2. The display device according to claim 1, wherein
   a length of the second adhesive portion parallel to the line is larger than a distance between the one end of the first adhesive portion and the another end of the first adhesive portion parallel to the line.

3. The display device according to claim 1, further comprising a flexible printed board, wherein
   the flexible printed board is connected to the first substrate at the peripheral area along one side of the first substrate,
   the cut-out portion is located at the peripheral area along one of the other sides of the first substrate.

4. The display device according to claim 1, wherein
   the first adhesive portion and the second adhesive portion are separated each other.

5. The display device according to claim 1, wherein
the space overlaps with the display area in a plan view, and
the space is connected to the outside of the display device via the cut-out portion.

6. The display device according to claim 1, wherein
the first adhesive portion has a plurality of cut-out portions,
the first adhesive portion is divided into pieces due to the plurality of the cut-out portions and
the second adhesive portion is divided into pieces corresponding to the cut-out portions.

7. The display device according to claim 6, further comprises a flexible printed board, wherein
the peripheral area includes a first side area, a second side area, a third side area, and a fourth side area,
the flexible printed board is connected to the substrate at the first side area,
each of the plurality of cut-out portions is located at one of the second, the third or the fourth area.

8. The display device according to claim 7, wherein
the first side area and the second side area are located at opposite sides each other across the display area in a first direction,
the third side area and the fourth side area are located at opposite sides each other across the display area in a second direction which intersects with the first direction,
one of the plurality of cut-out portions is located at a first place in the third side area and another one of the plurality of cut-out portions is located at a second place in the fourth side area, and
the first place and the second place are located at portions shifted in the second direction each other.

* * * * *